United States Patent
Weyer et al.

(10) Patent No.: US 11,848,175 B2
(45) Date of Patent: Dec. 19, 2023

(54) CORONA/PLASMA TREATMENT MACHINE

(71) Applicant: 3DT LLC, Germantown, WI (US)

(72) Inventors: Donald J. Weyer, Hubertus, WI (US);
Alex E. Kiel, Menomonee Falls, WI (US); Phillip Pulvermacher, Germantown, WI (US)

(73) Assignee: 3DT LLC, Germantown, WI (US)

( * ) Notice: Subject to any disclaimer, the term of this patent is extended or adjusted under 35 U.S.C. 154(b) by 77 days.

(21) Appl. No.: 17/702,391

(22) Filed: Mar. 23, 2022

(65) Prior Publication Data

US 2022/0310358 A1   Sep. 29, 2022

Related U.S. Application Data

(60) Provisional application No. 63/164,642, filed on Mar. 23, 2021.

(51) Int. Cl.
*H01J 37/32* (2006.01)
*H01J 37/24* (2006.01)

(52) U.S. Cl.
CPC ...... *H01J 37/32073* (2013.01); *H01J 37/241* (2013.01); *H01J 2237/038* (2013.01); *H01J 2237/06375* (2013.01)

(58) Field of Classification Search
CPC .......................... H01J 37/32073; H01J 37/241
See application file for complete search history.

(56) References Cited

U.S. PATENT DOCUMENTS

| | | | | |
|---|---|---|---|---|
| 5,638,660 A | * | 6/1997 | Kuo | B32B 27/08 53/449 |
| 2001/0052381 A1 | * | 12/2001 | Takai | D04H 1/542 156/209 |

FOREIGN PATENT DOCUMENTS

WO    WO-9962990 A1 * 12/1999 ............ B29C 59/12

* cited by examiner

*Primary Examiner* — Joseph L Williams
(74) *Attorney, Agent, or Firm* — Boyle Fredrickson, S.C.

(57) ABSTRACT

A corona/plasma treatment machine includes an array of electrodes arranged in a helix along a conductive central cylinder, allowing for the efficient surface treatment of materials with greater cross-sectional heights and widths than what is conventionally possible. The corona/plasma treatment machine further includes of a high frequency, high voltage power source, a dielectric, and a contact plate. The array of electrodes is driven using a motor and rotates about its longitudinal axis and is electrically isolated from its surroundings. When power is supplied to the electrode array, electrical energy is discharged from the tips of the electrodes near the contact plate and creates a plasma corona aura formed from the ionization of the surrounding air between the electrode array and the contact plate. A conveyor is positioned below the electrode array and configured to feed material through the plasma corona aura.

20 Claims, 11 Drawing Sheets

CORONA/PLASMA TREATMENT MACHINE

CROSS-REFERENCE TO RELATED APPLICATION

The present application claims priority to U.S. Provisional Application No. 63/164,642, filed Mar. 23, 2021. The entire contents of which are incorporated herein by reference.

FIELD OF THE INVENTION

The invention relates generally to industrial surface treatments, and in particular, to corona treatment machines for energizing the surfaces of low surface energy materials.

BACKGROUND OF THE INVENTION

Efforts have been made to treat plastics and surfaces of other materials in order to prepare them to accept inks, adhesives, cleaning solutions, and other coatings. This is often difficult due to the low surface energy of many plastics and other materials which cause polar molecules, such as water-based inks, to bead and not spread evenly across the surface, also known as a surface's wettability. Historically, a surface could be energized to using a flame or electrical sparks from a high voltage electrical discharge. However, these methods produce an uneven surface treatment and can even cause damage to the material being treated, making them inappropriate for most industrial applications. Another approach is to use a high frequency, high voltage, but low temperature plasma corona.

A power generator and high voltage transformer are connected to an electrode and create enough electrical potential to cross an airgap producing a visible plasma corona aura. The material is then fed through the corona to be treated. Current corona treatment machines have electrodes disposed onto a circular plate with the electrodes placed at various distances from the central shaft. Referring now to FIG. 1, an electrode array 100 of a conventional corona treatment machine is presented. It includes a circular disk 102 with sixteen tapered rods acting as electrodes 101 staggered at three separate radii 103 from the central rotating shaft. The shaft spins and disperses a plasma corona curtain widthwise across a material. The circular disk 102 is then rotated about a central shaft so that the individual electrodes 101 pass over the material at different insistences.

However, there are limitations to the width of material that can be treated using electrodes arranged such a way due to the geometry of the array and laws of physics. In addition, the electrodes at different radii rotate and different speeds and result in an inconsistent treatment. There has been a long-felt need in the industry for corona treatment machines that are able to robustly and efficiently treat large width materials with a consistent plasma corona.

SUMMARY OF THE INVENTION

According to an embodiment of the invention, a corona treatment machine is provided that allows for efficient means to treat materials with large cross-sectional heights and widths. This is achieved using an electrode array comprised of a plurality of electrodes arranged along a central conductive cylinder in a helical type pattern. A power source supplies the electrode array with high frequency, high voltage power, and an isolating structure electrically isolates the electrode array from its surroundings. A contact plate is positioned in close proximity to the electrode array to direct the electrical discharge of the electrodes. Further, a dielectric is placed between the electrode array and the contact plate. The high frequency, high voltage power ionizes the air surrounding the electrodes and creates a plasma corona used to energize the surface of various materials.

In accordance with another aspect of the invention, the contact plate may be either grounded or also electrically charged. The corona treatment machine may further comprise a feeding belt used to pass material through the plasma corona. Power may be supplied to the electrode array using an electrical contact and the isolating structure may include electrically isolated bearings in conjunction with a non-conductive portion of the electrode array that assist in mounting the electrode array to the machine while also electrically isolating the conductive cylinder from the machine. The electrodes in the electrode array may also be arranged in a plurality of congruent helixes about the central cylinder or other more complex helical patterns.

According to another embodiment of the invention, a method for treating a materials surface includes positioning a helical electrode array having a longitudinal axis above a contact plate and a dielectric layer. The helical electrode array includes a plurality of electrodes extending outward from a conductive portion of the helical electrode array in a helical pattern about the longitudinal axis. The method further includes supplying high voltage and high frequency power to the conductive portion of the helical electrode array, rotating the helical electrode array about its longitudinal axis, and moving material to be treated between the helical electrode array and the dielectric.

In accordance with another aspect of the invention, rotating the helical electrode array about its longitudinal axis further includes rotating distal ends of the plurality of electrodes about the longitudinal axis. As a result, the distal ends of less than all of the plurality of electrodes are directed toward the contact plate at any given time. As a result, the method may further include generating a plasma corona aura between the distal ends of less than all of the plurality of electrodes directed toward the contact plate at any given time. Further yet, the helical pattern of the plurality of electrodes of the electrode array is configured to have the distal ends of at least some of the plurality of electrodes directed toward the contact plate in order to consistently generate the plasma corona aura between the helical electrode array and the contact plate.

In accordance with yet another aspect of the invention, the method may include electrically insulating the conductive portion of the helical electrode array via a non-conductive portion of the helical electrode array.

According to yet another embodiment of the invention, a helical electrode array for a treatment machine includes a conductive portion rotatable around a longitudinal axis, a plurality of electrodes extending outward from the conductive portion in a helical pattern about the longitudinal axis, an isolating structure coupled to the conductive portion and configured to electrically isolate the conductive portion from the treatment machine.

In accordance with another aspect of the invention, the isolating structure may include a non-conductive portion coupled to at least one end the conductive portion and rotatable around the longitudinal axis. As a result, rotation of the non-conductive portion is transferred to the conductive portion. Further yet, the insolating structure may also include bearings disposed between the conductive portion and the non-conductive portion.

In accordance with yet another aspect of the invention, the conductive portion is disposed above a contact plate of the treatment machine. As a result, the distal ends of the plurality of electrodes rotate about the longitudinal axis in order to orient less than all of the plurality of electrodes toward the contact plate at any given time. As a result, less than all of the plurality of electrodes oriented are discharging and producing a plasma corona aura at any given time.

In accordance with another aspect of the invention, the conductive portion includes a plurality of openings formed in an outer surface thereof in the helical pattern. Each of the plurality of electrodes may be mounted within a respective one of the plurality of openings. In varying embodiments of the invention, the helical pattern of the plurality electrodes and the plurality of openings may vary. For instance, the helical pattern may include a plurality of congruent helixes.

These and other aspects and objects of the present invention will be better appreciated and understood when considered in conjunction with the following description and the accompanying drawings. It should be understood, however, that the following description, while indicating preferred embodiments of the present invention, is given by way of illustration and not of limitation. Many changes and modifications may be made within the scope of the present invention without departing from the spirit thereof, and the invention includes all such modifications.

BRIEF DESCRIPTION OF THE DRAWINGS

A clear conception of the advantages and features constituting the present invention, and of the construction and operation of typical mechanisms provided with the present invention, will become more readily apparent by referring to the exemplary, and therefore non-limiting, embodiment illustrated in the drawings accompanying and forming part of this specification. The following provides a brief description of the included figures.

Figure 1:
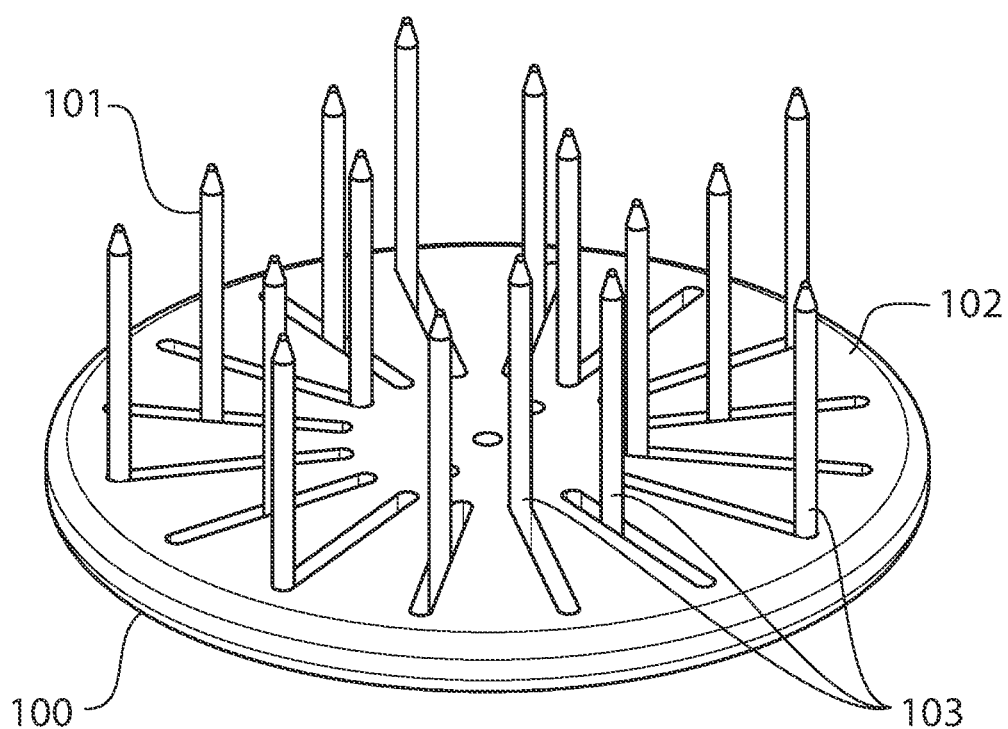
FIG. 1 is a perspective view of a disk type electrode array from a conventional corona treatment machine known in the prior art.

Before the embodiments of the invention are explained in detail, it is to be understood that the invention is not limited in its application to the details of construction and the arrangement of the components set forth in the following description or illustrated in the drawings. The invention is capable of other embodiments and of being practiced or being carried out in various ways. Also, it is to be understood that the phraseology and terminology used herein are for the purpose of description and should not be regarded as limiting. The use of "including" and "comprising" and variations thereof is meant to encompass the items listed thereafter and equivalents thereof as well as additional items and equivalents thereof.

DETAILED DESCRIPTION OF THE PREFERRED EMBODIMENT

Figure 2:
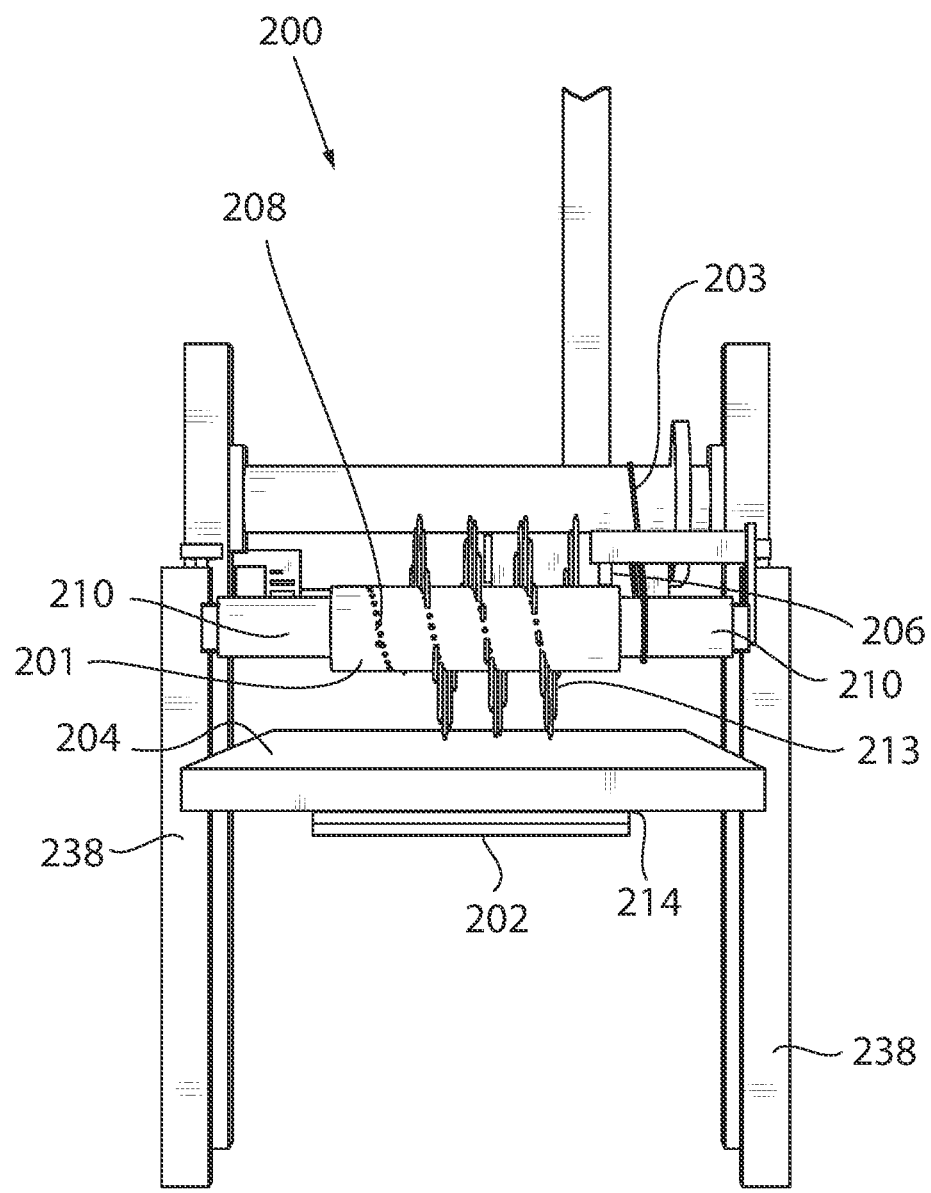
FIG. 2 is an elevation view of a corona treatment machine according to an embodiment of the presently claimed invention.
Figure 3:
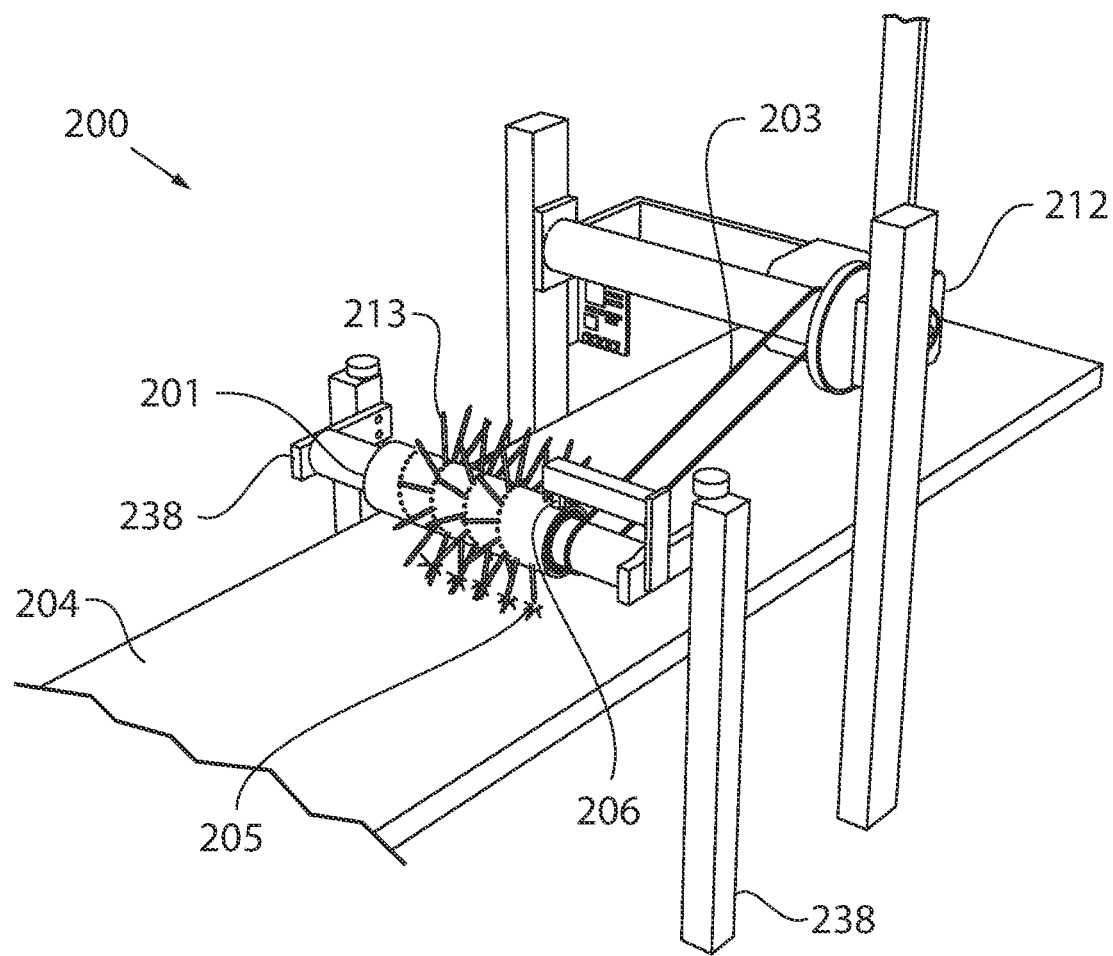
FIG. 3 is a perspective view of the corona treatment machine of FIG. 2, while it is in operation.

Referring now to the present invention and starting with FIGS. 2 and 3, a corona treatment machine 200 embodying the presently claimed invention is presented. The machine 200 includes a helical electrode array 201 including a number of electrodes 213 extending from an outer surface thereof in a helical pattern. Typically, the electrodes 213 are oriented in a double helical pattern. In varying embodiments of the invention, the electrodes 213 may be oriented in other helical patterns, such as a single helical pattern, a triple helical pattern, or other more complex helical patterns.

The machine 200 includes a motor 212 to transmit rotational motion to the helical electrode array 201 via a drive belt 203. As will be described in further detail below, the motor 212 and drive belt 203 are electrically insulated from the helical electrode array 201. A power source 300 supplies high voltage, high frequency power to the helical electrode array 201 and its electrodes 213 via a contact 206, such as a brush. For example, the power source 300 may be a transformer, battery, or other known power source.

The electrode array 201 is positioned over a conveyor 204 which feeds a material (not shown) past the electrode array 201. A plate 202 is placed underneath the conveyor 204. A dielectric layer 214 is disposed between the electrode array 201 and the plate 202. More specifically, the dielectric layer is disposed between the conveyor 204 and the plate 202. Typically, the dielectric layer 214 is a sheet of glass, but many other types of insulating materials may be used to achieve similar results.

A material (not shown) to be treated is placed on the conveyor 204 to move through the machine 200. While the representative embodiment of the invention depicts the conveyor 204 as a conveyor belt 204, it is contemplated that alternative conveyance devices may be used to move or convey the material through the machine 200. The conveyor 204 moves the material beneath and past the electrode array 201. As the material passes underneath the electrode array 201, the material is treated by a plasma corona 205 generated between the electrodes 213 of the electrode array 201 and the contact plate 202 below the conveyor 204. The discharge of power between the electrodes 213 and the contact plate 202 ionizes the air between the electrodes 213 and the contact plate 202 to create the plasma corona 205. In turn, as a material passes between the electrodes 213 and the contact plate 202 on the conveyor 204, the plasma corona 205 generated between the electrodes 213 and the contact plate 202 are able to energize and treat the surface of the material. The plasma corona 205 is shown in FIG. 3.

Typically, the contact plate 202 is in the form of a grounding plate 202 and is electrically grounded. In other embodiments of the invention, the contact plate 202 may be electrical coupled to a high frequency, high voltage power source 180 degrees out of phase from the power supplied by the power source 300 to the electrode array 201 to create a "push-pull" configuration. In such an embodiment, the electrical potential across the airgap between the electrodes 213 of the electrode array 201 and the contact plate 202 and allows for the plasma corona 205 to be effective across greater vertical distances, i.e., able to effectively treat thicker materials and products. As described in further detail below, the present invention allows for less than all of the electrodes 213 to be discharging at the same time. In turn, the electrode array 201 of the present invention is able to generate a plasma corona 205 across a larger airgap than that of the prior art.

FIG. 3 illustrates the corona treatment machine 200 in operation. The motor 212 running the non-conductive belt 203 and a second motor running the conveyor 204 are activated, feeding material through the machine 200 and spinning the helical electrode array 201 about its longitudinal axis 216. Typically, the spinning speed of the electrode array 201 can vary in speed from about 20 rpm to 3000 rpm depending on the particular application and still achieve similar results. More typically, the electrode array 201 spins at around 200 rpm to 400 rpm. Typically, the conveyor belt 204 is run about 1 to 12 feet per minute. Typically, power is supplied to the electrode array 201 from the power source 300 at a voltage between 8 to 150 kV and at a frequency of between 10 to 50 kHz using a contact 206 in contact with an outer surface of a conductive portion 208 of the electrode array 201. More typically, the voltage ranges from 10 to 60 kV and the frequency ranges from 20 to 50 kHz. In the representative embodiment of the invention, the contact 206 is in the form of a carbon brush contact. However, other embodiments of the invention may use other brush materials such as copper and even "brushless" type electrical contacts to provide power to the electrode array 201. When in operation, the machine produces a plasma corona 205 between the electrodes 213 of the electrode array 201 adjacent the conveyor 204 and the conveyor 204.

As previously discussed, the electrode array 201 is electrically isolated from the motor 212 via a separate non-conductive belt 203. As a result, the electrode array 201 is able to be electrically isolated from its surroundings. The helical arrangement of the electrodes 213 on the electrode array 201 provides an arrangement where a reduced number of electrodes 213 are in close enough proximity to the contact plate 202 to discharge and create a plasma corona 205 at any given time. That is, only the electrode 213 adjacent the contact plate 213 during rotation are configured to discharge and create the plasma corona 205. Typically, less than 20% of the electrodes 213 are discharging and creating a plasma corona 205 at any given time. More typically, about 10% of the electrodes 213 are in a discharge state and creating a plasma corona 205 at any given time.

In other words, as the electrodes 213 rotate around the longitudinal axis 216, they are moved to locations nearer and further from the contact plate 202. As the electrodes 213 rotate and begin to be directed downward toward the contact plate 202, these electrodes 213 begin to initialize and enter the discharge state to create a plasma corona 205. As stated above, when the electrodes 213 are generally directed downward, those electrodes 213 are in the discharge state and create the plasma corona 205. In turn, when the electrodes 213 rotate away from the contact plate 202, they exit the discharge state and stop creating a plasma corona 205 as new electrodes 213 are rotated into the discharge state and other new electrodes are rotated into initiating the discharge state. Due to the helical arrangement of the electrodes 213, a number of electrodes 213 less than the total amount of electrodes 213 are always directed downward toward the contact plate 202 and producing a plasma corona 205 to treat a material. In turn, a consistent plasma corona 205 exists between the electrode array 201 and the contact plate 202 during operation of the machine 200 to treat the material being conveyed.

Typically, 10% of the electrodes 213 are initializing and entering the discharge state, 10% of the electrodes 213 are in the discharge state, and 10% of the electrodes 213 are exiting the discharge state. By easing into the discharge state with an entering phase and an exiting phase, each electrode 213 is able to be eased in and out of the discharge state. In turn, a consistent power supply is demanded of the power supply 300 during operation.

In addition, the typically 70% of electrodes 213 that are not initializing, in, or exiting the discharge state are able to cool while they rotate. In turn, the wear on each electrode 213 is reduced due to none of the electrodes 213 being in a constant discharge state.

This arrangement is more forgiving than more conventional designs, such as that shown in FIG. 1, and doesn't require a high degree of orthogonality between the components. Additional benefits of this type of design includes lower power usage due to the fewer number of electrodes 213 discharging at any given time. In addition, by spinning around a longitudinal axis 216 oriented parallel to the conveyor 204, the electrodes 213 have equal surface speed relative to each other in order to move at the same speed across the material being treated and therefore provide a consistent surface treatment. Comparatively, the electrodes 101 of the prior art shown in FIG. 1 have different surface speed depending on the radii location 103.

Next, FIGS. 4-7 further illustrate a representative embodiment of the helical electrode array 201 of the present invention. The electrode array 201 includes a central conductive portion or cylinder 208. Typically, the central portion 208 is manufactured from 6000 series aluminum for its machinability and resistance to corrosion, but other embodiments of the invention may use any conductive material that is sufficiently resistant to corrosion, including, but not limited to, other aluminum alloys, stainless steel and ceramics. Due to the significant volume of ozone produced as a byproduct of the plasma corona 205 ionizing the surrounding air during operation, it is preferred that the machine 200 be manufactured from corrosion restive materials.

The central portion 208 is machined to include a number of openings 209 and corresponding flat surfaces formed through the exterior wall 220 of the central portion 208 to be used as mounting points for the electrodes 213. As previously discussed, the openings 209 may be formed in a helical pattern (single helical pattern, double helical pattern, triple helical pattern, etc.). The electrodes 213 are mounted into the openings 209 of the central portion 208 in a manner so as to electrically connected to each other.

It is contemplated that the central portion 208 may include more mounting openings 209 than electrodes 213 used. That is, the electrodes 213 may be arranged in the openings 209 of the central portion 208 as needed for different applications of the machine 200. In the representative embodiment of the invention, the electrodes 213 are arranged in a double helical structure spaced between 0.25 and 4.0 inches around the spiral at a pitch of between 0.25 and 4.0 inches. However, other helical arrangements and spaces may be used dependent on the particular material and geometry of the products being treated. Preferably, the pitch and spacing would be such that any single electrode 213 is equidistant from its closest neighboring electrodes 213.

Further, the present embodiment only depicts a central portion 208 having a length of about 16 inches, but other embodiments could include central portions 208 and helical electrode arrays 201 of much greater lengths and different diameters to accommodate differently sized materials. For example, the length of the central cylinder could be anywhere from 2 inches to over 16 feet, and the diameter could range between 1.0 inch and 2 feet. Other embodiments of the claimed invention may also include a series of independent helical electrode arrays 201 working in tandem to treat larger materials or to provide better throughput. For instance, multiple helical electrode arrays 201 may be positioned along the length of the conveyor 204 in series.

Figure 8:
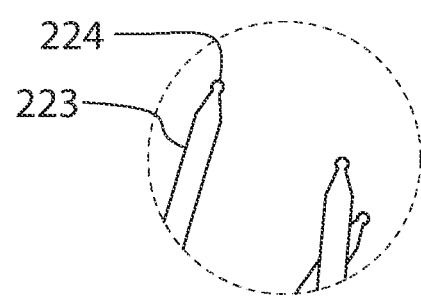
FIG. 8 is an enlarged perspective view of an electrode of the helical electrode array of FIG. 4.
Figure 4:
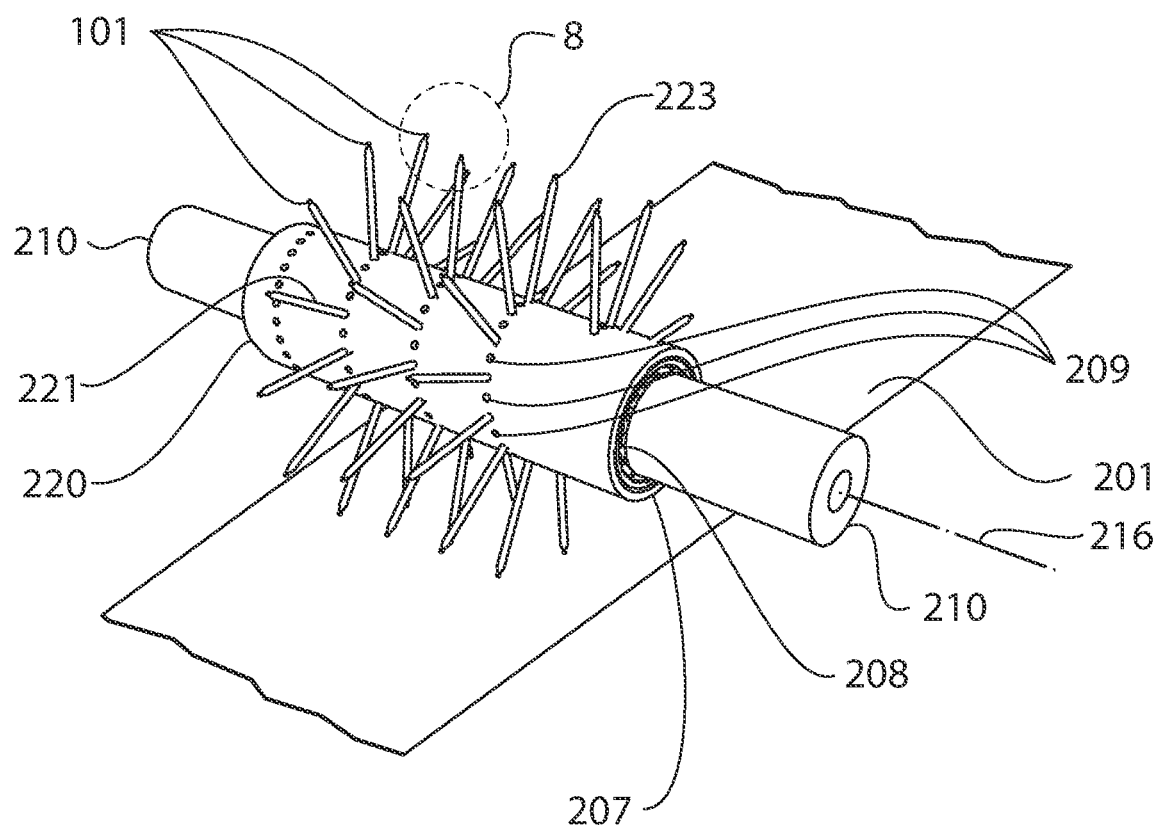
FIG. 4 is a perspective view of the helical electrode array of the corona treatment machine of FIG. 2.
Figure 5:
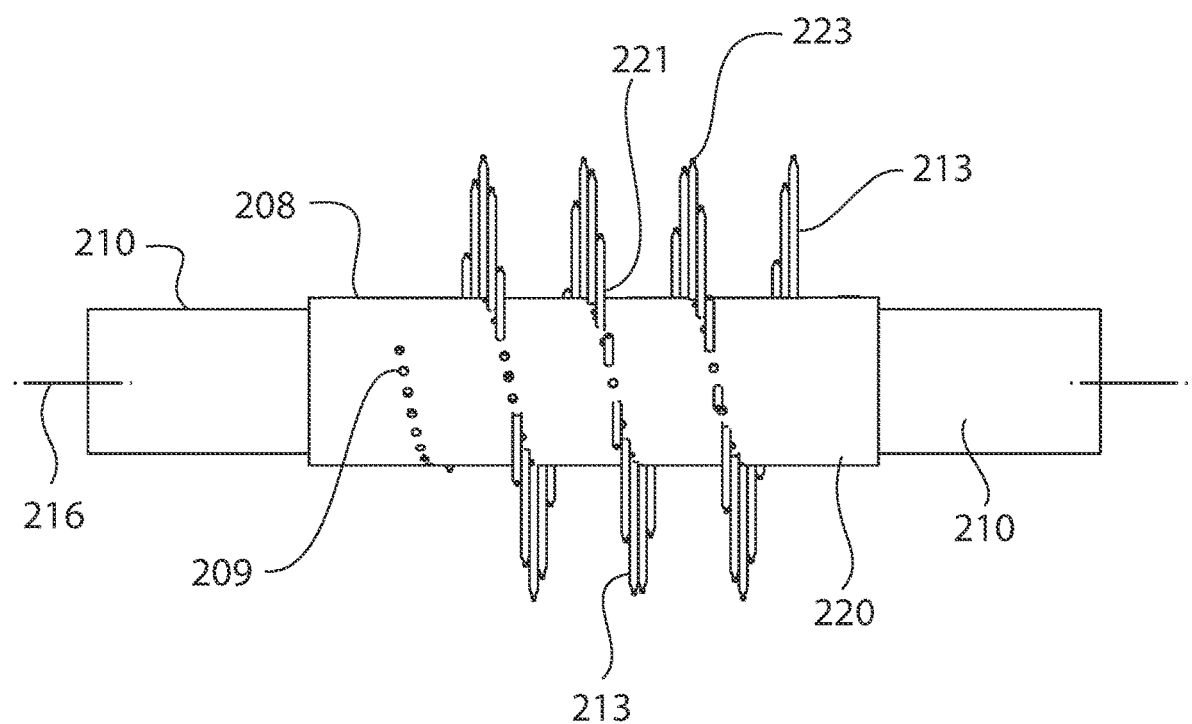
FIG. 5 is a front elevation view of the helical electrode array of FIG. 4.
Figure 6:
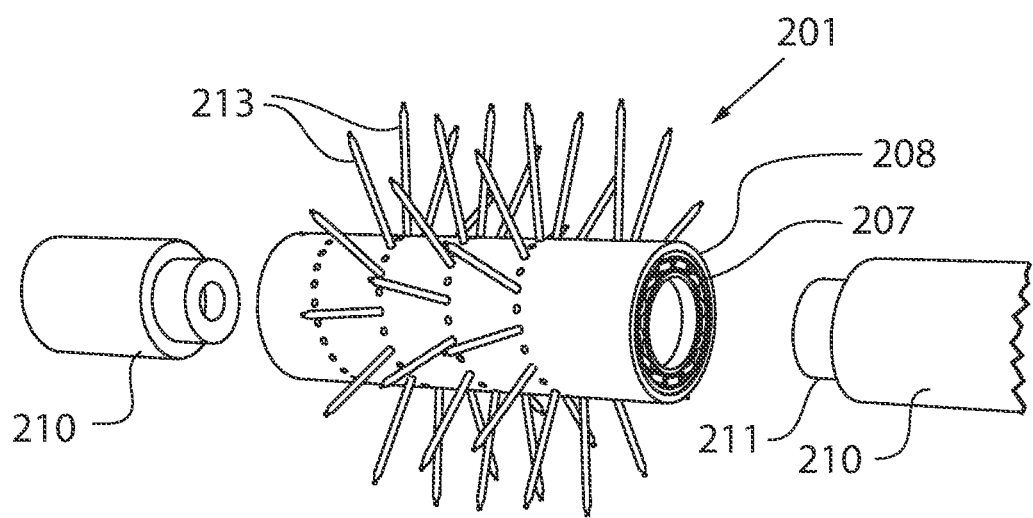
FIG. 6 is an exploded perspective view of the helical electrode array of FIG. 4.
Figure 7:
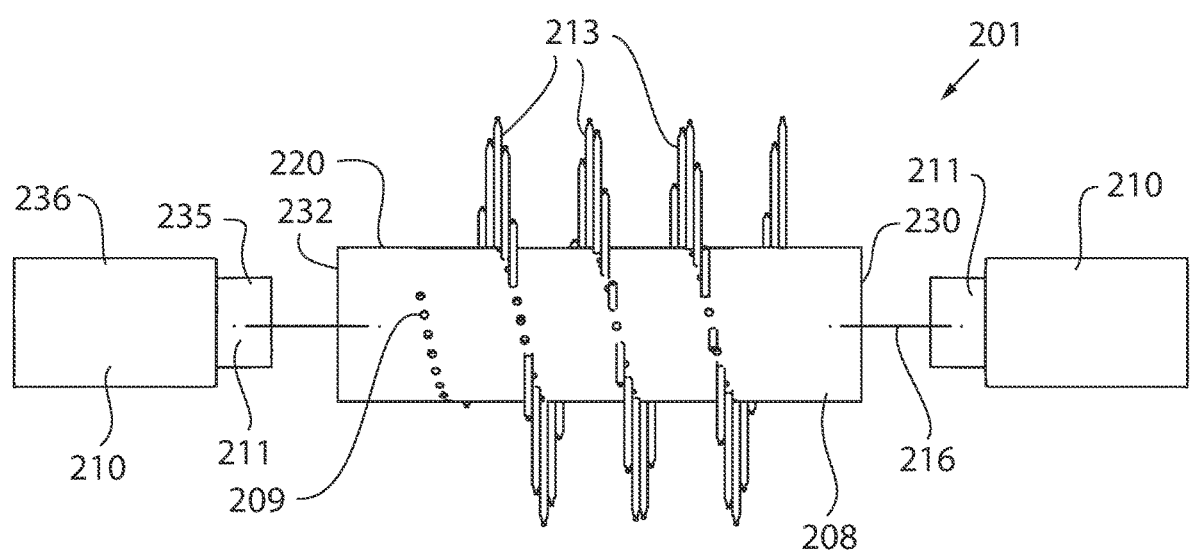
FIG. 7 is an exploded front elevation view of the helical electrode array of FIG. 4.

As shown in FIG. 8, the electrodes 213 may be substantially rod shaped and tapered to a point at a distal end 223. The electrode 213 further includes a sphere 224 disposed at the point at the distal end 223 of the electrode 213 to alter the electromagnetic field at the electrode's tip and encourage the localized discharge of electrical energy to create the plasma corona 205. Typically, the sphere 224 has a diameter of 5/64 inch. In the representative embodiment of the invention, the electrodes 213 may be approximately 6 inches long and approximately 0.50 inches in diameter. However, any similar shaped structure would be effective. For similar reasons as the central cylinder 208, the electrodes 213 are manufactured out of stainless steel for its resistive properties, but it is contemplated that electrodes 213 may be made from other alloys or ceramics with similar properties.

The electrode 213 may also include a base portion 221 having an orifice and internal threading configured to receive a fastener with complimentary threads to secure the electrode 213 to the central portion 208. In other embodiments of the invention the base portion 221 of the electrodes 213 may be threaded and inserted into a respective hole 209. It is also contemplated that, the central portion 208 may be manufactured in two halves to provide easier mounting of the electrodes 213.

Referring still to FIGS. 4-7, the electrode array 201 further includes two flanking non-conductive outer portions 210 disposed at first and second opposite ends 230, 232 of the center portion 208 along the same longitudinal axis 216. A shoulder (not shown) is formed in the first and second ends 230, 232 and configured to receive a pair of bearings 207 in each end 230, 232. Typically, the pair of bearings 207 are then press fit into both ends 230, 232 of the central portion 208, such that the outer races of the bearings 207 abut against the center portion 208. Meanwhile, the inner races of the bearings 207 are mounted onto collars 211 of the respective outer non-conductive portions 210. With respect to each outer portion, the collar 211 is disposed at inner edges 235 of the outer portion 210 and has a reduced diameter compared to the main body 236 of the outer portion 210.

Typically, the outer portions 210 are manufactured from PET, but other embodiments of the invention could include outer portions 210 manufactured from any similar non-conductive but rigid material. The helical electrode array 201 may then be mounted to a machine frame 238 via the non-conductive outer portions 210 in order to electrically isolate the central portion 208 from the machine 200. For example, a hole may be machined out of each of the non-conductive outer portions 210 to provide a means for supporting the entire electrode array 201. Referring again to FIGS. 2 and 3, the belt 203 of the motor 212 is typically in contact with one of the non-conductive outer portions 210 in order to electrically isolate the central portion 208 from the motor 212.

In other embodiments, the bearings 207 themselves may be electrically isolated. Other embodiments of the invention may use other methods to electrically isolate the electrode array 201, including but not limited to designs using alternative arrangements of bearings or bushings which allow for the central portion 208 to fully rotate while also being supported and electrically isolated. In embodiments with larger central portions 208, a different method to mount the bearings 207 may be used. Here, only one of the bearings 207 would be press fit into the end of the central cylinder 208, while another bearing would be placed on an external collar using a set screw. This would allow the bearing to be removable and repositioned depending on the application. Additionally, multiple externally mounted bearings could be used to support the electrode array 201 along the central portion 208 at regular increments.

The bearings 207 and the non-conductive portions 210 work in conjunction to provide an isolating structure 242 that electrically isolates the conductive portion 208 and electrodes 213 of the electrode array 201 from the machine 200.

Figure 9:
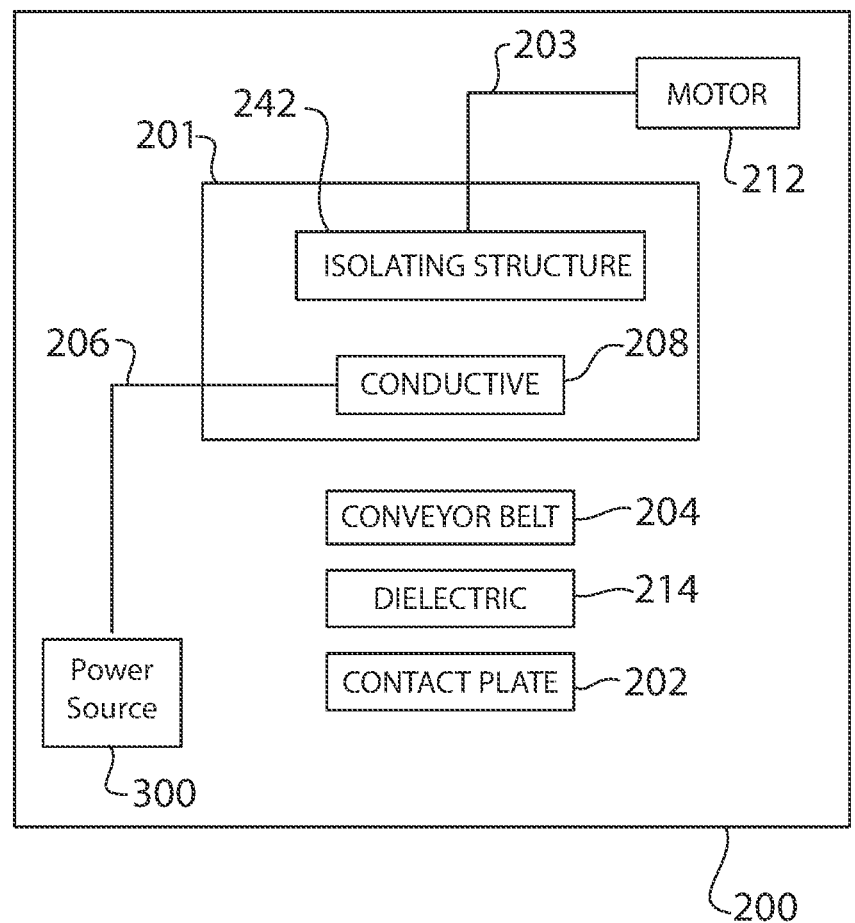
FIG. 9 is a block diagram view of the corona treatment machines of FIGS. 2 and 9.

Next, FIG. 9 illustrates a block diagram of the machine 200. As shown and previously described, the machine 200 includes an electrode array 201 mounted to a frame 238 and disposed above a conveyor 204, such as a conveyor belt. In turn, the conveyor belt 204 is coupled to a motor 240 that controls the speed of the conveyor belt 204 and, as a result, the speed at which a material passes under the electrode array 201. The electrode array includes a conductive portion 208 electrically coupled to a power source 300 to provide high voltage and high frequency power to the conductive portion 208 of the electrode array 213.

The electrode array 201 further includes at least one non-conductive portion 210 coupled to the conductive portion 208 of the electrode array 201. The non-conductive portion 210 is also coupled to a motor 212 via a pulley or belt 203 that translates motion from the motor 212 to rotation of the non-conductive portion 210 of the electrode array 201 around the longitudinal axis 216. The non-conductive portion 210 and the belt 203 are configured to electrically insulate and isolate the conductive portion 208 of the electrode array 201 from the motor 212.

The non-conductive portion 210 is further coupled to the conductive portion 208 via bearings 207 to translate rotational motion of the non-conductive portion 210—powered by the motor 212—to the conductive portion 208, which, in turn, causes the electrodes 213 mounted to the conductive portion 208 to rotate around the longitudinal axis 216. In the representative embodiment of the invention shown in FIGS. 1-8, the conductive portion 208 is a central portion 208 of the electrode array 201. However, alternative embodiments of the invention may include other configurations of the electrode array 201 that result in the conductive portion 208 be off-center. For instance, one non-conductive portion 210 may be longer than the other or the electrode array 201 may be cantilevered from the frame 238 with a single non-conductive portion 210.

Additionally, a contact plate 202 is disposed underneath the conveyor belt 204 at a location below the electrode array 201 so as to interact with the generally downward facing electrodes 213 of the electrode array 201 to create a plasma corona 205 within the airgap therebetween. While the contact plate 204 is shown as being grounded in the representative embodiment of the invention, other embodiments of the invention may include a power source coupled to the contact plate 204. In the representative embodiment of the invention, a dielectric layer 214 is disposed between the electrode array 201 and the contact plate 202 and more specifically between the conveyor belt 204 and the contract plate 202.

As described above, the electrode array 201 and the conveyor belt 204 may be operated by two separate motors 212, 240 and, therefore, are independently adjustable. In turn, the speed of the conveyor belt 204 moving the material underneath the electrode array 201 and the speed of the rotation of the electrode array 201 may be independently adjusted depending on the material being sent through the machine 200.

Figure 10:
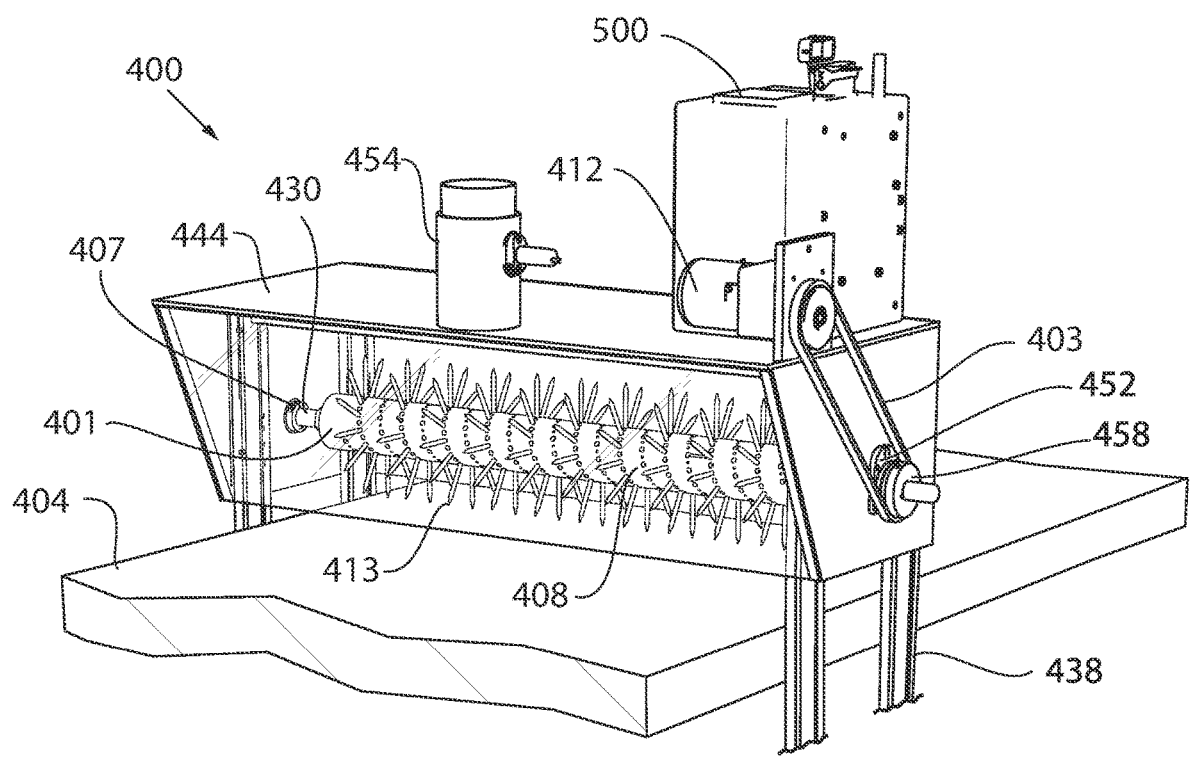
FIG. 10 is a perspective view of a corona treatment machine according to another embodiment of the invention.
Figure 11:
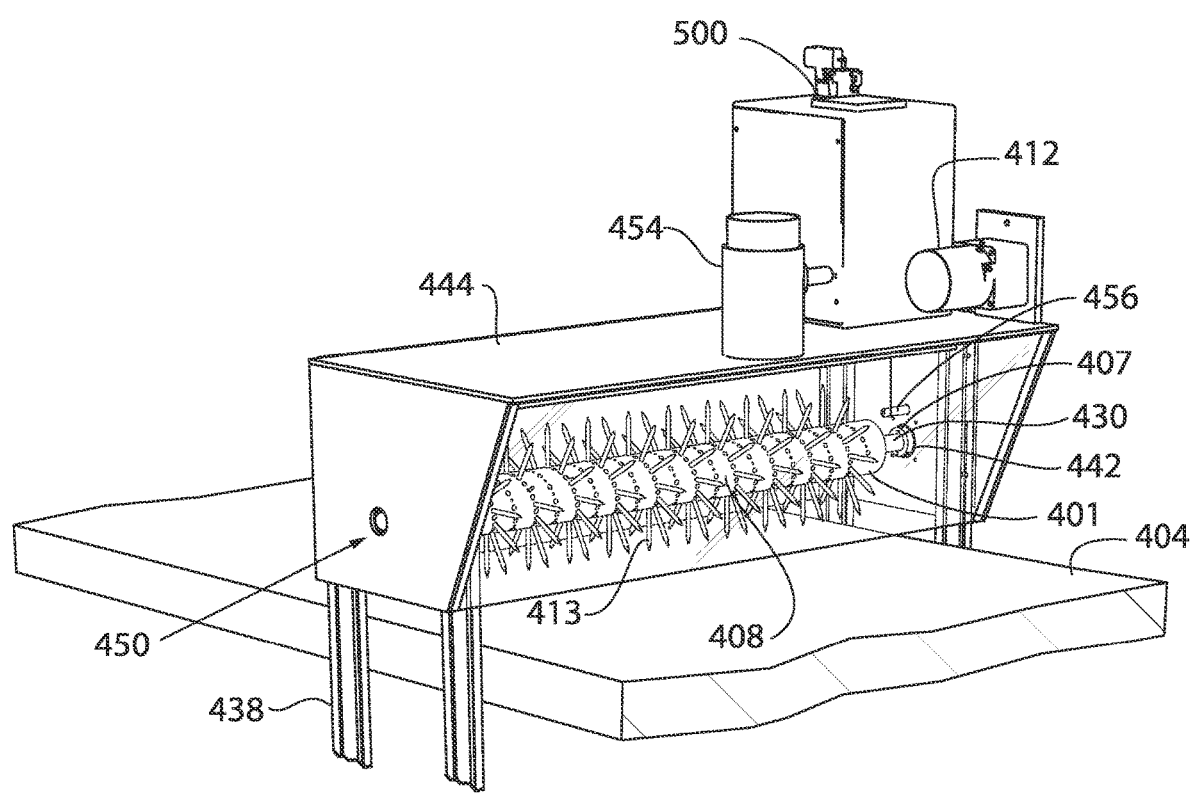
FIG. 11 is an alternative perspective view of the corona treatment machine of FIG. 10

Referring now to FIGS. 10 and 11, a treatment machine 400 according to another embodiment of the invention is shown. The treatment machine 400 is similar to the previously described treatment machine 200 and includes a helical electrode array 401 including a number of electrodes 413 extending from an outer surface thereof in a helical pattern. The helical pattern may include any number of helical patterns including a single helical pattern, a double helical pattern, a triple helical pattern, or other more complex helical patterns with any number of congruent helixes.

Figure 12:
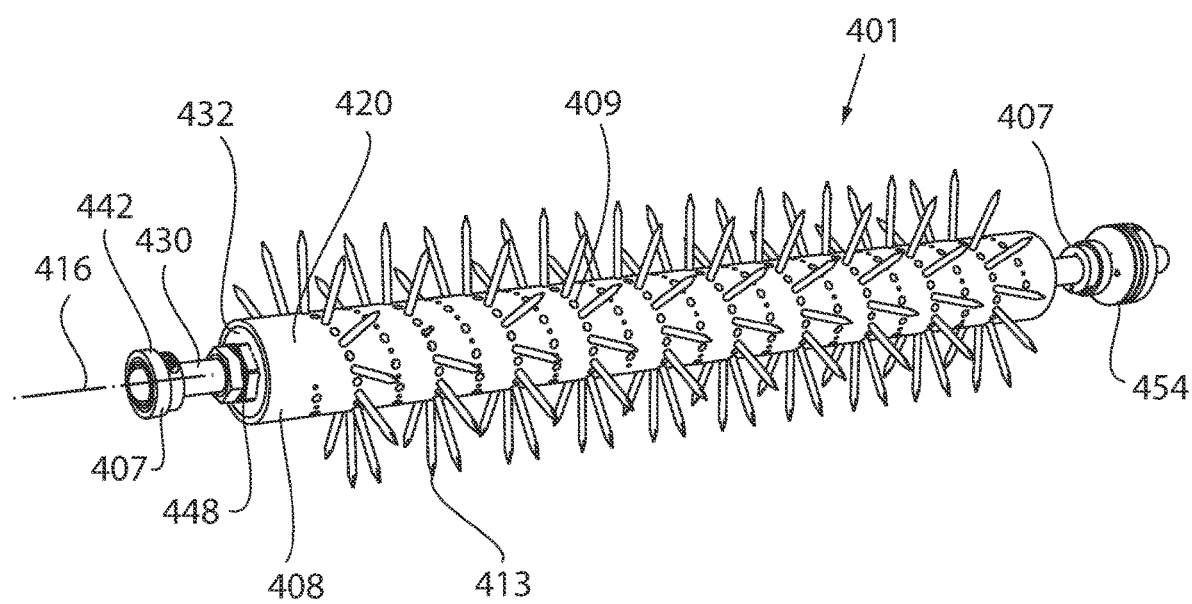
FIG. 12 is a perspective view of the helical electrode array of the corona treatment machine of FIG. 10.

As shown in FIG. 12, the helical electrode array 401 includes a central conductive portion or cylinder 408 that is disposed within an enclosure 444 above a conveyor belt 404. The enclosure may be mounted to a frame 438 of the machine 400. The electrode array 401 further includes a shaft 430 oriented along the same longitudinal axis 416 as the central portion 408. As shown, the shaft 430 may extend beyond the central portion 408 and to or through opposite sidewalls of the enclosure 444. Typically, the central portion 408 and shaft 430 are manufactured from 6000 series aluminum for its machinability and resistance to corrosion, but other embodiments of the invention may use any conductive material that is sufficiently resistant to corrosion, including, but not limited to, other aluminum alloys, stainless steel and ceramics.

The central portion 408 of the electrode 401 may be in the form of a hollow cylinder. In turn, the shaft 430 may run through the length of the central portion 408. As a result, the shaft 430 and the central portion 408 are oriented along the same longitudinal axis 416. To translate rotation of the shaft 430 to the central portion 408, a locking collar 448 may be used to secure the central portion 408 to the shaft 430. As shown in FIGS. 10-12, the locking collar 448 is typically disposed on a single side of the central portion 408, such as side 432. In turn, the opposite side of the central portion 408 is able to expand as necessary as the central portion 408 heats and cools during operation of the machine 400. The above notwithstanding, it is contemplated that other embodiments of the invention may include multiple locking collars 448 to secure the central portion 408 to the shaft 430.

The central portion 408 is machined to include a number of openings 409 formed in the exterior surface 420 of the central portion 408 to be used as mounting points for the electrodes 413. The openings 409 may be formed in a helical pattern (single helical pattern, double helical pattern, triple helical pattern, etc.). The electrodes 413 are mounted into the openings 409 of the central portion 208 in a manner so as to electrically connected to each other. Further details regarding openings 409 and electrodes 413 are equivalent to that discussed above regarding openings 209 and electrodes 213.

The machine 400 includes an isolating structure 442 disposed adjacent opposing sidewalls of the enclosure 444. As depicted, opposing sidewalls of the enclosure 444 may include openings 450 formed therein and centered on the longitudinal axis 416 of the electrode array 401. The isolating structure 44 is in the form of an electrically insulated bearing 407 disposed within each opening 450 and configured to receive the shaft 430 and allow the shaft 430 to rotate about the longitudinal axis 416. The isolating structure 442 may further include electrically insulated mount 452 configured to secure the bearings 407 in the openings 450. Typically, the insulated mount 452 is made from plastic, but other electrically insulated materials are contemplated.

Referring again to FIGS. 10 and 11, the machine 400 includes a motor 412 that transmits rotational motion to the helical electrode array 401 via a drive belt 403. As shown in FIG. 9, the motor 400 is typically mounted to the enclosure 444 and electrically insulated from the motor 402 via a non-conductive drive belt 403 and a non-conductive gear 458 disposed on the electrode array 401. FIG. 10 illustrates the shaft 430 extending through the opening 450 of the enclosure 444 and through the insulating structure 442. In turn, the non-conductive gear 458 is mounted to shaft 430 of the electrode array 401. As a result, movement of the motor 412 is translated to the gear 458 via the drive belt 403 and rotation of the gear 458 is translated to the shaft 430 and electrode array 201. Typically, the insulated gear 458 is made from plastic, but it may also be made from other electrically insulated materials. While not shown in FIGS. 10 and 11, it is contemplated that end caps may be placed over the ends of the shaft 430 to further electrically insulate the electrode array 201 from the machine 400 and the surroundings.

A power source 500 supplies high voltage, high frequency power to the electrode array 401 and its electrodes 413 via a contact 406 similar to contact 206 described above. In this embodiment of the invention, the power source 500 may be a transformer mounted to the enclosure 444. In other embodiments of the invention, the power source 500 may be a transformer, battery, or the like mounted to the machine 400 at any location or external thereto. Operation of the power source 500 is similar to that described above with respect to power source 300.

In this representative embodiment of the invention, the contact 406 may be in contact with the shaft 430 of the electrode array 201. In particular, the contact 406 may be in the form of a brush, such as a carbon brush, disposed within the insulated mount 452 in order to be electrically insulated from the enclosure 444 and the machine 400 while in electrical contact with the shaft 430. Alternatively, the contact 406 may be in contact with the central portion 408 directly. In addition, FIG. 11 illustrates the contact 406 having an extension portion 456 extending into the enclosure 444. In turn, the power source 500 may be electrically coupled to the extension portion 456 to provide power to the contact 406 and, in turn, the electrode array 401.

FIGS. 10 and 11 further illustrate the enclosure 444 including an exhaust 454. As stated above, a significant volume of ozone is produced as a byproduct of the plasma corona ionizing the surrounding air during operation. As such, the exhaust 454 provides ventilation for the enclosure 444 to release the produced ozone. It is contemplated that the exhaust 454 may be coupled to a ventilation system. FIGS. 10 and 11 also illustrate at least one of the walls of the enclosure 444 being translucent in order to allow a user to watch the material as it is being treated by the machine 400 and the electrode array 401.

The electrode array 201 is positioned over a conveyor 404, similar to conveyor 204, which feeds a material (not shown) past the electrodes 413 of the electrode array 401. While not visible in FIGS. 10 and 11, the machine 400 may include a contact plate and dielectric layer below the conveyor 404, as shown in FIG. 2 and described above. Operation of the conveyor 404 and generation of the plasma corona are similar to that described above with respect to conveyor 204, machine 200, and electrodes 213.

It is specifically intended that the present invention not be limited to the embodiments and illustrations contained herein, but includes modified forms of those embodiments including portions of the embodiments and combinations of elements of the different embodiments as within the scope of the following claims.

What is claimed is:

1. A treatment machine comprising:
    a power source;
    an electrode array in electrical communication with the power source, the electrode array comprising:
        a central portion having a longitudinal axis;
        a plurality of electrodes extending outward from the conductive portion in a helical pattern about the longitudinal axis; and
        an isolating structure coupled to the central portion and configured to electrically isolate the central portion from the treatment machine;
    a contact plate;
    a dielectric positioned between the electrode array and the contact plate;
    wherein the central portion is configured to rotate about its longitudinal axis, and the power source is configured to supply high frequency, high voltage power to the electrode array.

2. The treatment machine of claim 1, wherein the contact plate is either electrically charged by a second power source or electrically grounded.

3. The treatment machine of claim 1, further comprising a conveyor configured to guide material through the treatment machine and between the electrode array and the contact plate.

4. The treatment machine of claim 1, wherein the power source supplies power to the central portion of the electrode array via a contact.

5. The treatment machine of claim 1, wherein the helical pattern comprises a plurality of congruent helixes.

6. The treatment machine of claim 1, further comprising a motor electrically insulated from and coupled to the electrode array and configured to translate rotation to the central portion.

7. The treatment machine of claim 1, wherein less than all of the plurality of electrodes are directed toward the contact plate at any given time.

8. The treatment machine of claim 7, wherein less than all of the plurality of electrodes in a discharge state and producing a plasma corona aura at any given time.

9. A method for treating a materials surface, comprising:
    positioning a helical electrode array having a longitudinal axis above a contact plate and a dielectric layer, the helical electrode array including a plurality of electrodes extending outward from a central portion of the helical electrode array in a helical pattern about the longitudinal axis;
    supplying high voltage and high frequency power to the central portion of the helical electrode array;
    rotating the helical electrode array about its longitudinal axis; and
    moving material to be treated between the helical electrode array and the dielectric.

10. The method of claim 9, wherein rotating the helical electrode array about its longitudinal axis further comprises rotating distal ends of the plurality of electrodes; and
    wherein the distal ends of less than all of the plurality of electrodes are directed toward the contact plate at any given time.

11. The method of claim 10, further comprising generating a plasma corona aura between the distal ends of less than all of the plurality of electrodes directed toward the contact plate at any given time.

12. The method of claim 11, wherein the helical pattern of the plurality of electrodes of the electrode array is configured to have the distal ends of at least some of the plurality of electrodes directed toward the contact plate in order to consistently generate the plasma corona aura between the helical electrode array and the contact plate.

13. A helical electrode array for a treatment machine, the helical electrode array comprising:
    a central portion rotatable around a longitudinal axis;
    a plurality of electrodes extending outward from the conductive portion in a helical pattern about the longitudinal axis; and
    an isolating structure coupled to the central portion and configured to electrically isolate the conductive portion from the treatment machine.

14. The helical electrode array of claim 13, wherein the isolating structure includes at least one bearing to electrically isolate the helical electrode array while allowing rotation of the central portion around the longitudinal axis.

15. The helical electrode array of claim 14, wherein the central portion includes a plurality of openings formed in an outer surface thereof in the helical pattern; and
    wherein each of the plurality of electrodes are mounted within a respective one of the plurality of openings.

16. The helical electrode array of claim 14, wherein the helical pattern comprises a plurality of congruent helixes.

17. The helical electrode array of claim 13, further comprising a shaft extending through the central portion and aligned along the longitudinal axis, wherein rotation of the shaft is transferred to the central portion.

18. The helical electrode array of claim 13, wherein the conductive portion is disposed above a contact plate of the treatment machine.

19. The helical electrode array of claim 18, wherein distal ends of the plurality of electrodes rotate about the longitudinal axis in order to orient less than all of the plurality of electrodes toward the contact plate at any given time.

20. The helical electrode array of claim 19, wherein the less than all of the plurality of electrodes oriented toward the contact plate are discharging and producing a plasma corona aura at any given time.

* * * * *